(12) United States Patent
Assaderaghi et al.

(10) Patent No.: US 6,424,011 B1
(45) Date of Patent: *Jul. 23, 2002

(54) MIXED MEMORY INTEGRATION WITH NVRAM, DRAM AND SRAM CELL STRUCTURES ON SAME SUBSTRATE

(75) Inventors: Fariborz Assaderaghi, Mahopac; Louis Lu-Chen Hsu, Fishkill; Jack A. Mandelman, Stormville, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/387,059

(22) Filed: Aug. 31, 1999

Related U.S. Application Data

(60) Continuation-in-part of application No. 09/159,470, filed on Sep. 23, 1998, now Pat. No. 6,232,173, which is a division of application No. 08/824,702, filed on Apr. 14, 1997, now Pat. No. 5,880,991.

(51) Int. Cl.⁷ .......................... H01L 27/01; H01L 27/12
(52) U.S. Cl. ...................... 257/350; 438/258; 438/155
(58) Field of Search ............................... 438/241, 238, 438/248, 253, 257, 244, 256, 594, 597, 155, 258

(56) References Cited

U.S. PATENT DOCUMENTS

| | | | |
|---|---|---|---|
| 4,053,335 A | 10/1977 | Hu ............................. | 148/174 |
| 4,646,271 A | 2/1987 | Uchiyama et al. ............ | 365/49 |
| 4,703,456 A | 10/1987 | Arakawa .................... | 365/185 |
| 4,720,323 A | 1/1988 | Sato ........................... | 438/261 |
| 4,757,360 A | 7/1988 | Faraone ..................... | 357/23.5 |
| 4,799,194 A | 1/1989 | Arakawa .................... | 365/154 |
| 4,813,018 A | 3/1989 | Kobayashi et al. .......... | 365/185 |
| 5,051,958 A | 9/1991 | Arakawa .................... | 365/228 |
| 5,057,448 A | 10/1991 | Kuroda ...................... | 438/241 |
| 5,065,201 A | 11/1991 | Yamauchi ................... | 357/23.5 |
| 5,075,888 A | 12/1991 | Yamauchi et al. ........... | 365/228 |
| 5,189,641 A | 2/1993 | Arakawa .................... | 365/228 |
| 5,196,722 A | 3/1993 | Bergendahl et al. ......... | 257/304 |
| 5,250,827 A | 10/1993 | Inoue et al. ................. | 257/295 |
| 5,399,516 A | 3/1995 | Bergendahl et al. ......... | 438/589 |
| 5,442,210 A | 8/1995 | Kanehachi ................... | 257/296 |
| 5,488,579 A | 1/1996 | Sharma et al. .............. | 365/185 |
| 5,496,756 A | 3/1996 | Sharma et al. .............. | 438/258 |
| 5,612,238 A * | 3/1997 | Sato et al. ................... | 438/241 |
| 5,656,537 A | 8/1997 | Iwamatsu et al. ........... | 438/402 |
| 5,773,152 A | 6/1998 | Okonogi ...................... | 428/446 |
| 5,792,681 A * | 8/1998 | Chang et al. ................ | 438/210 |
| 5,866,451 A * | 2/1999 | Yoo et al. .................... | 438/241 |
| 5,877,525 A | 3/1999 | Ahn ............................ | 257/321 |
| 5,880,991 A | 3/1999 | Hsu et al. .................... | 365/182 |

FOREIGN PATENT DOCUMENTS

JP          1293569        11/1989      ........... H01L/29/78

OTHER PUBLICATIONS

Feb. 1999, Electronic Engineering; Field Programming—the Future: A Progress Report by Ron Neale.

Thin Solid Films 270—(1995) 584–588 Ferroelectric non–volatile memories for low–voltage, low power applications, by R.E. Jones., Jr., et al.

IEEE—1997—A High Stability Electrode Technology for Stacked SrBi2Ta2)9 Capacitors Applicable to Advanced Ferroelectric Memory by J. Kudo, et al.

Advanced 0.5 um FRAM Device Technology With Full Compatibility of Half–Micron CMOS Logic Device IEEE 197 by Tatsuya Yamzaki, et al.

* cited by examiner

Primary Examiner—Charles Bowers
Assistant Examiner—Hsien-Ming Lee
(74) Attorney, Agent, or Firm—Joseph P. Abate

(57) ABSTRACT

A semiconductor memory device including an NVRAM cell structure, a DRAM cell structure and an SRAM cell structure. The NVRAM cell structure, the DRAM cell structure, and the SRAM cell structure are on the same semiconductor on insulator substrate. An NVRAM cell structure. Processes for forming a memory structure that includes NVRAM, DRAM, and/or SRAM memory structures on one semiconductor on insulator substrate and processes for forming a new NVRAM cell structure. Preferably, the semiconductor-on-insulator substrate is an SOI substrate, a silicon on glass substrate or a silicon on sapphire substrate, as appropriate for a particular application.

9 Claims, 11 Drawing Sheets

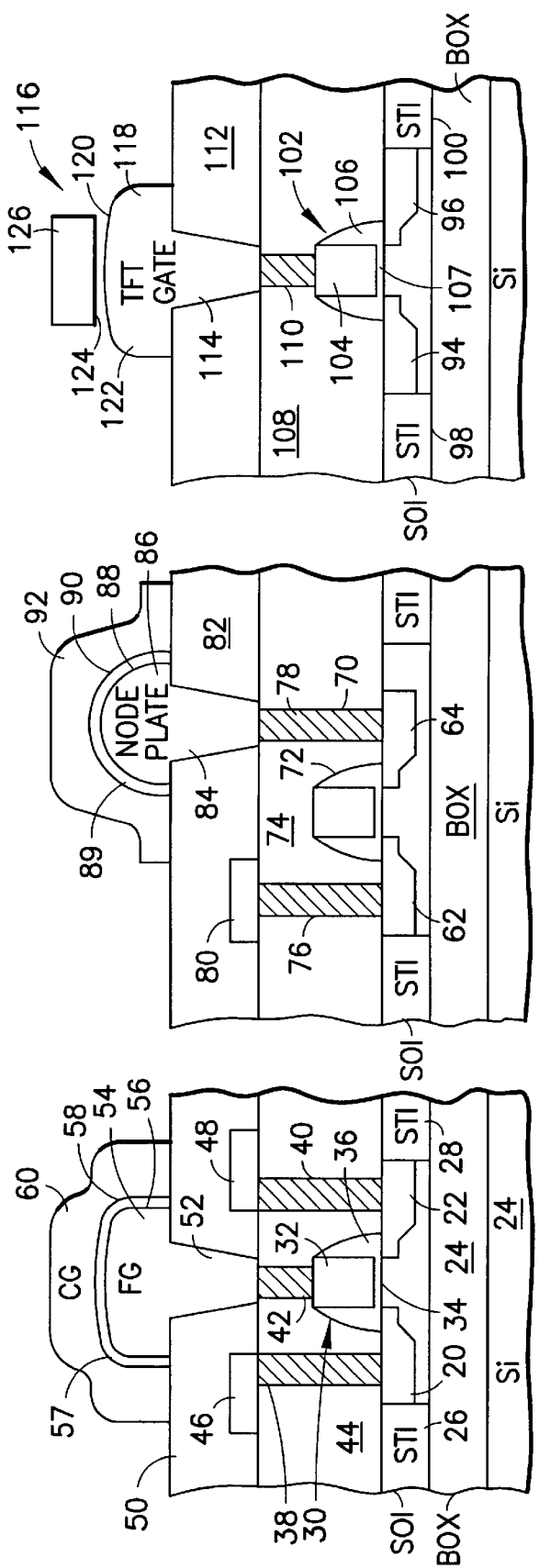

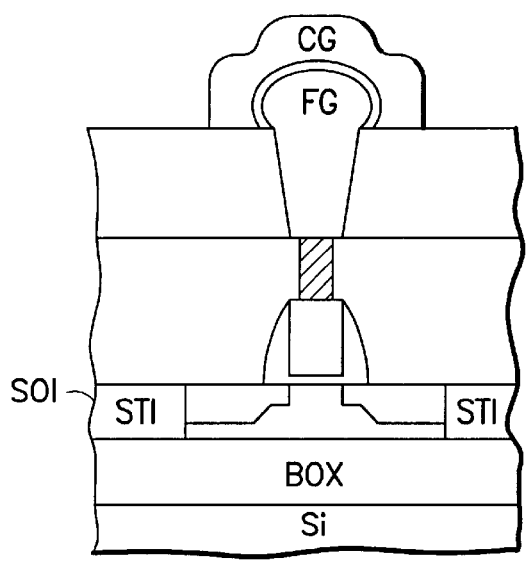
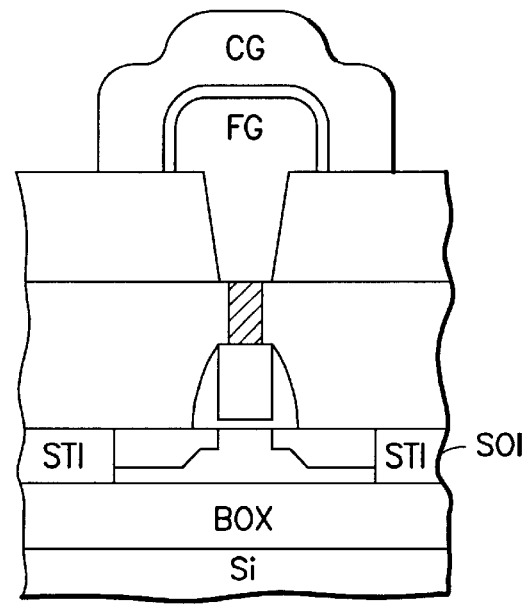
FIG.3a
FIG.4a
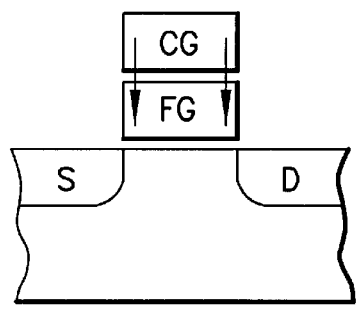
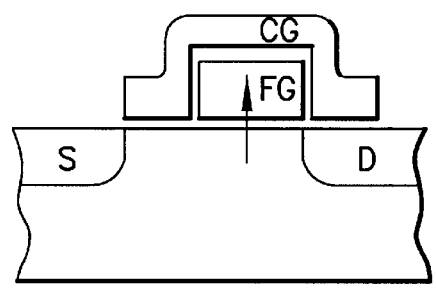
FIG.3b
FIG.4b

MIXED MEMORY INTEGRATION WITH NVRAM, DRAM AND SRAM CELL STRUCTURES ON SAME SUBSTRATE

This application is a continuation-in-part of application Ser. No. 09/159,470 filed Sep. 23, 1998 which is a division of application Ser. No. 08/824,702, filed Apr. 14, 1997, now U.S. Pat. No. 5,880,991, all commonly owned.

FIELD OF THE INVENTION

The present invention relates to a new memory structure for use in high density memory chips. In particular, the present invention provides a memory structure that includes NVRAM, DRAM, and/or SRAM memory structures on one substrate. The present invention also includes a new NVRAM cell structure. Additionally, the present invention relates to processes for forming a memory structure that includes NVRAM, DRAM, and/or SRAM memory structures on one substrate and processes for forming a new NVRAM cell structure.

BACKGROUND OF THE INVENTION

Laser fusible redundancy technology plays a key role for improving the yield of today's high density memory chips. However, disadvantages exist associated with such technology. For example, devices produced according to the technology are bulky and costly in terms of chip area. The fuse blowing process that may occur in devices according to this technology may damage adjacent devices. The fuse blowing process is time consuming and unreliable, and the fuses are not reprogrammable.

As memory circuits become more sophisticated, it is often necessary to incorporate a block of EEPROM into other memory arrays, such as DRAM or SRAM. One example of such a device is a "smart card". In a smart card, RAM serves as a scratch pad, ROM stores programs and runs the cards operating system, EEPROM includes user data, and a microcontroller allocates the memory and runs an encryption program. One example of a smart card is described in John Gallant, *Smart Cards*, EDN, Nov. 23, 1995, pp. 34–42, the entire disclosure of which is hereby incorporated by reference.

It is a great challenge to design a high density, small chip size, low cost smart card integrated circuit. Such devices have many inherent problems. For example, chip sizes larger than 25 mm$^2$ are prone to experiencing fractures when a card is flexed.

Additionally, at least with respect to logic devices, it is recognized in the art that the need for ever increasing performance has driven a migration from bulk substrates to other substrates such as semiconductor-on-insulator substrates (e.g., silicon-on-insulator or SOI substrates, silicon-on-glass substrates or silicon-on-sapphire substrates). For example, CMOS logic circuits disposed (e.g. formed) on SOI substrates may realize performance increases of 30% over bulk counterparts using the same design groundrules. Logic circuitry which supports various types of memory also benefits from these performance increases by providing higher bandwidth between the logic circuitry and the memory elements. These logic devices include, but are not limited to, CMOS and bipolar devices.

The present inventors believe that migration to other than bulk substrates will benefit memory elements. Therefore, this invention covers new memory structures (i.e. NVRAM, SRAM, DRAM structures) formed on substrates other than bulk substrates, such as SOI substrates. Increased performance from the logic circuitry can then likely be realized.

With reference to FIG. 1A, there is shown a conventional SOI wafer or SOI substrate. The wafer, which may be formed by SIMOX or bonding methods well known in the art, includes a base layer A2, an insulating layer A3 and an SOI layer A1. See, for example, U.S. Pat. Nos. 5,656,537, 5,646,053 which are hereby incorporated in their entireties by reference. The base layer, provided primarily for structural support, is typically a semiconductor, preferably silicon. The insulating layer is normally silicon dioxide and is approximately 60–500 nm thick. The insulating layer alternatively comprises silicon nitride, phosphosilicate glass, borophosphosilicate glass or composite layers of silicon dioxide, silicon nitride, phosphosilicate glass, and/or borophosphosilicate glass. The SOI layer A1, which is approximately 50–500 nm thick, is typically silicon, but can alternatively be silicon-germanium. The SOI layer A1 has been heat treated. In the case of an SOI wafer formed by a SIMOX method as mentioned herein above, the heat treatment serves to repair any defects created therein during preceding processing steps. In the case of an SOI wafer formed by a bonding method, the heat treatment serves to promote bonding of the two substrates.

SUMMARY OF THE INVENTION

The present invention seeks to overcome the above problems as well as others by providing new memory structures and methods for making the structures.

The inventors realized that it would be very desirable to replace the fuses described above with EEPROM cells, or nonvolatile memory. However, they also realized the difficulties in combining processes for forming different types of memory cells on the same substrate. Known processes for combining different types of memory cells involve many complex process steps, many extra masking levels and material layers to fabricate more than one type of memory cell on a single chip. Such processes are time consuming and costly. An alternative approach integrated memory cells only on a system level, rather than on the same chip.

The present invention provides a solution to the above by providing compatible memory cell structures and processes for forming different memory cell structure types on a single substrate other than a bulk substrate, such as a semiconductor-on-insulator (SOI) substrate.

The present invention also provides a new NVRAM cell structure.

According to preferred aspects, the present invention provides a semiconductor memory device including an NVRAM cell structure, a DRAM cell structure, and an SRAM cell structure on a single substrate other than a bulk substrate, such as a semiconductor-on-insulator substrate.

According to additional preferred aspects, the present invention provides a new NVRAM cell structure that includes an extended planarized floating gate.

According to other preferred aspects, the present invention provides processes for forming a semiconductor memory device including an NVRAM cell structure, a DRAM cell structure, and an SRAM cell structure on the same semiconductor-on-insulator substrate and associated with a plurality of gate structures, including first polysilicon layers. The method includes depositing a second polysilicon layer over the gate structures. A floating gate of an NVRAM cell is formed by patterning the second layer of polysilicon over at least a stud interconnection connected to one of said gate structures on said substrate and associated with a first drain region and a first source region in the substrate. A capacitor of a DRAM cell or an SRAM cell is formed by patterning the second layer of polysilicon over at least a second drain region formed in the substrate. A thin layer of a dielectric is deposited over exposed surfaces of the patterned second polysilicon layer. A third layer of polysilicon is deposited on the patterned second polysilicon layer. A control gate of the NVRAM cell is formed by patterning the third polysilicon layer over the dielectric layer deposited on corresponding patterned portions of the second polysilicon layer. A ground plate of the DRAM cell or the body of a Thin-Film Transistor(TFT) SRAM cell is formed by patterning the third polysilicon layer over the dielectric layer deposited on corresponding patterned portions of the second polysilicon layer.

Furthermore, preferred aspects of the present invention also include an semiconductor memory device formed according to the above process.

Still other objects and advantages of the present invention will become readily apparent to those skilled in the art from the following description. The detailed description shows and describes on preferred embodiments of the invention so as to illustrate the best mode contemplated for carrying out the invention. As those skilled in art will realize, the invention includes other and different embodiments. Details of the invention may be modified in various respects, without departing from the invention. Accordingly, the drawings and description should be regarded as illustrative in nature rather than restrictive.

BRIEF DESCRIPTION OF THE DRAWINGS

FIGS. 2a–2c represent cross-sectional views of an embodiment of a mixed memory device according to the present invention that includes embodiments of an NVRAM cell structure, a stacked capacitor DRAM cell structure, and a TFT SRAM cell structure formed in a silicon layer of an SOI substrate;

FIG. 3a represents a cross-sectional view of one embodiment of an NVRAM cell structure formed according to the present invention that includes a roughened area on the floating gate and the control gate;

FIG. 3b represents a conventional structure of an NVRAM cell, corresponding to the new structure shown in FIG. 3a, wherein programming is carried out from the control gate to the floating gate;

FIG. 4a represents an another embodiment of an NVRAM cell structure according to the present invention that includes a larger area interfaced between the floating gate and the control gate wherein the interface is less rough than the embodiment shown in FIG. 3a;

FIG. 4b represents a conventional structure of an NVRAM cell, corresponding to the new structure shown in FIG. 4a, wherein programming is carried out from the drain or substrate to the floating gate;

DETAILED DESCRIPTION OF THE INVENTION

Figure 1A:
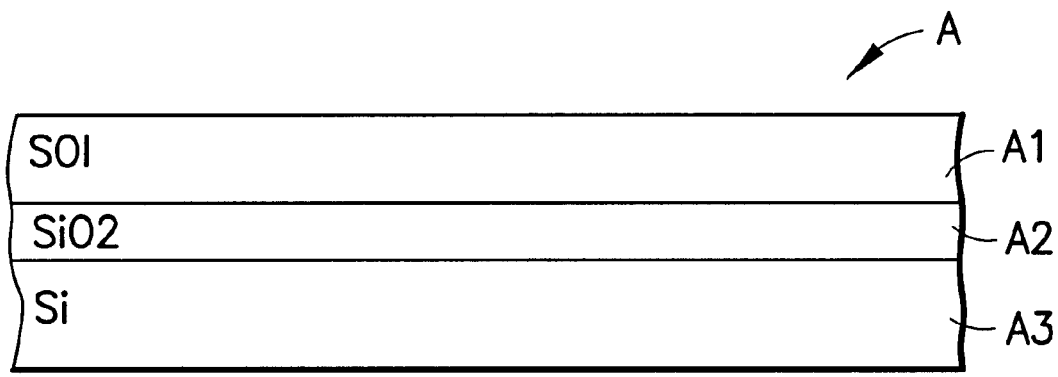
FIG. 1A is a cross-sectional side schematic view of a conventional SOI substrate or SOI wafer.
Figure 1B:
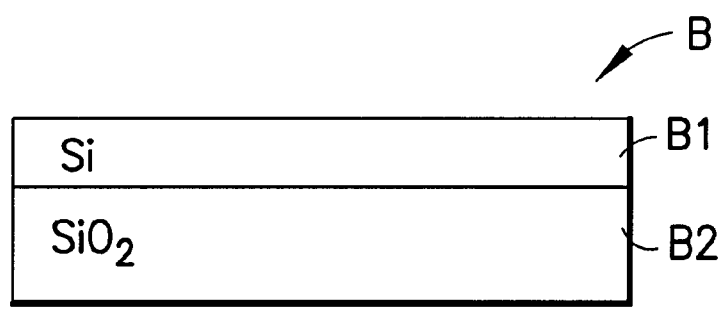
FIG. 1B is a cross-sectional side schematic view of a known silicon-on-glass substrate.
Figure 1C:
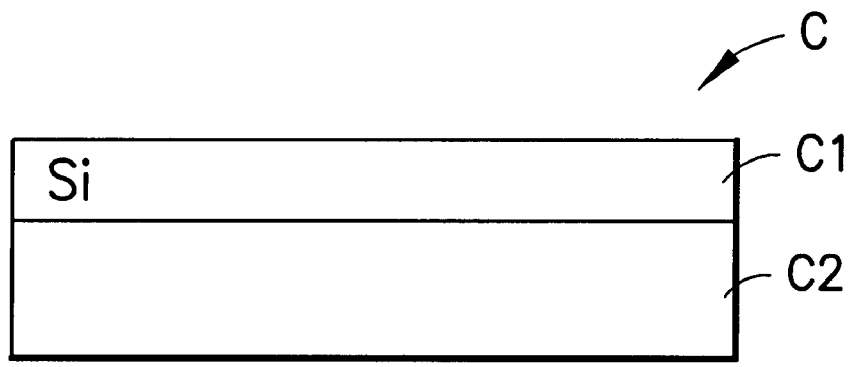
FIG. 1C is a cross-sectional side schematic view of a known silicon-on-sapphire substrate.
Figure 1D:
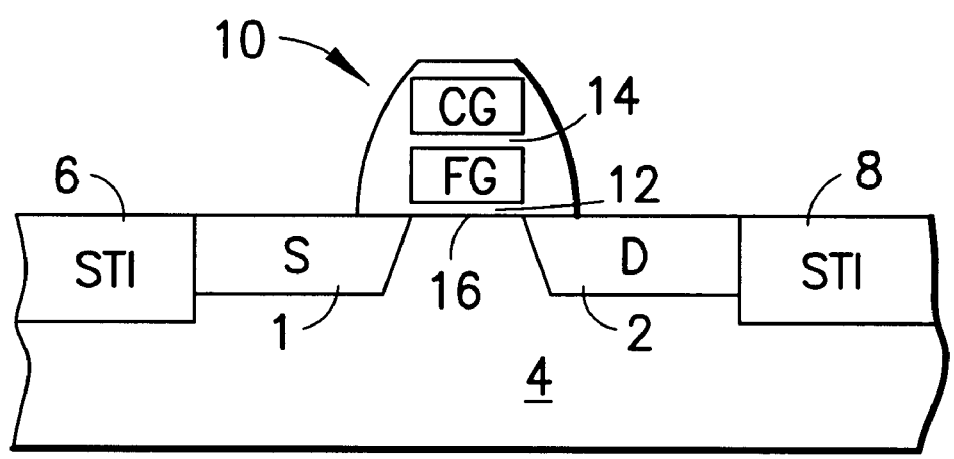
FIG. 1D represents a cross-sectional view of a prior art conventional stacked gate NVRAM cell structure disposed on a bulk substrate.

FIG. 1D shows a typical known conventional stacked gate NVRAM cell structure. The structure shown in FIG. 1D includes a source region 1 and a drain region 2 formed in a bulk (e.g., Si) substrate 4. Shallow trench isolation regions 6 and 8 are formed at the edge of the source and drain region, respectively, in the substrate.

A stacked gate structure 10 is provided on the surface of the substrate 4 above at least a portion of the source region 1 and the drain region 2. As shown in FIG. 1D, the floating gate 12 is formed closest to the substrate. The control gate 14 is formed above the floating gate 12.

A very thin insulating layer 16 lies underneath the floating gate 12 between the floating gate and the surface of the substrate 4. The insulating layer 16 permits carriers to be tunneled through a certain voltage level between the drain 2, or substrate 4, and the control gate 14 to program the floating gate 12. Once the device is programmed, the threshold of the device changes. Changes in the threshold can, in turn, determine the "on/off" state of the device.

The insulating layer may be made of an oxide material. Preferably, the insulating material is silicon dioxide.

The conventional stack gate NVRAM cell structure shown in FIG. 1D is very difficult to integrate with conventional DRAM, especially high density trench capacitor DRAM. This is because the trench capacitor of the DRAM must be formed before the gate. Even at the gate level, an extra polysilicon layer is needed for the NVRAM.

One possible solution investigated for providing a process compatible with forming NVRAM, DRAM, and SRAM is to use a stacked capacitor DRAM cell structure or a TFT (Thin-Film Transistor) SRAM cell structure as part of an NVRAM. Since the capacitor and the TFT are formed after the gate, it is possible to share the top polysilicon layer of the grounded plate of the capacitor or the body of the TFT device with the control gate of the NVRAM. However, use of the conventional and the RAM structure shown in FIG. 1D and discussed above is not suitable for use with this approach.

The present invention overcomes difficulties in forming NVRAM structures on the same substrate as other memory cell structures. The substrate is a semiconductor-on-insulator substrate such as an SOI substrate, a silicon-on-sapphire substrate or a sapphire-on-glass substrate. The present invention provides a process compatible for forming NVRAM cell structures, DRAM cell structures, and SRAM cell structures on a single substrate. In providing such a process, the present invention avoids time, resource consumption process and cost associated with known processes for forming different types of memory cells on one substrate.

Although the present invention provides a process for forming different memory cell structures on a semiconductor-on-insulator substrate, high voltage devices and related processes might still need to be carried out. However, the extra process steps needed for forming high voltage peripheral devices for an NVRAM are not discussed herein.

Examples of high voltage peripheral devices include a charge-pump and boosted W/L driver. These devices require thicker oxide layers so that oxide reliability can be preserved. For an example of a boosted W/L driver, see U.S. Pat. No. 5,513,142, the entire disclosure of which is hereby incorporated by reference. Also, I/O circuits may "see" "high-voltage". Therefore different oxide thicknesses may be provided for these applications.

Also, those skilled in the art in view of the present disclosure will readily recognize the known semiconductor-on-insulator substrates employed in the present invention. Such substrates include, for example, the SOI substrate (FIG. 1A), the silicon-on-glass substrate including a silicon layer B1 disposed on a glass layer B2 (FIG. 1B), and the silicon-on-sapphire substrate including a silicon layer C1 disposed on sapphire layer C2 (FIG. 1C). Of course, according to a particular application, the semiconductor layer A1, B1, C1 may be a silicon-germanium layer. Silicon-on-glass substrates and/or (eg, epitaxially grown) silicon-on-sapphire substrates are taught in, for example, "Silicon Processing for the VLSI Era," Vol. 1, ppgs. 124–158, S. Wolf and R. N. Tauber, LATTICE PRESS, 1986; "Fabrication of High Mobility p-Channel Poly-Si Thin Film Transistors by Self-Aligned Metal Induced Lateral Crystallization," vol. 17, No. 8, IEEE ELECTRON DEVICE LETTERS, ppgs. 407–409, August 1996; U.S. Pat. Nos: 5,441,591, 5,864,162, 5,895,957, 5,492,857, all hereby incorporated by reference in their entireties.

Accordingly, the processes of making such substrates shall not be further discussed. Also, those skilled in the art in view of the instant disclosure will readily recognize how to employ such substrates as part of the present invention. Therefore, such employment shall be discussed further only with respect to an exemplary SOI substrate.

The new NVRAM cell structure of the present invention utilizes the topology and material layers from the stacked capacitor DRAM. The present invention utilizes dual polysilicon layers to form a stack capacitor. This approach may also be utilized in forming a TFT device. When forming the TFT device in this manner, the bottom polysilicon layer may be utilized as a gate of the p-FET load device. The top polysilicon layer may be utilized for the body of the TFT.

FIGS. 2a, 2b, and 2c show cross-sectional views of an embodiment of a memory device including embodiments of an NVRAM cell structure, a DRAM cell structure, and a SRAM cell structure according to the present invention. The embodiment of the NVRAM cell structure shown in FIG. 2a, includes a source region 20 and a drain region 22 formed in a silicon layer (SOI) of an SOI substrate 24. Again, shallow trench isolation regions 26 and 28 are provided in the SOI substrate adjacent the source and drain region, respectively. Preferably, the shallow trench isolation regions 26 and 28 extend to the top of the insulating layer such as a back oxide layer (BOX).

A gate level is formed on the SOI substrate above at least a portion of both the source region 20 and the drain region 22. The gate level includes the gate structure 32. The gate structure 32 may be separated from the SOI substrate 24 and the source 20 and drain 22 by a thin layer of an insulating material 34. The gate structure 32 may be isolated by region 36.

The insulating material 34 may be an oxide material. Preferably, the insulating material is silicon dioxide.

Stud interconnections 38, 40, and 42 may be formed above the source region 20, drain region 22, and gate structure 32, respectively. As discussed above, the stud interconnections may be formed in different locations in different types of memory cells. The stud interconnections may be formed from a variety of electrically conducting materials. Examples of materials that may be utilized in forming the stud interconnection are tungsten, aluminum, titanium, and tantalum.

In the embodiment shown in FIG. 2a the stud interconnections and the gate structure are surrounded by a layer of a dielectric 44. Examples of dielectric materials that may be utilized in the first dielectric layer include CVD oxide.

A first level of metallization may be deposited over the stud interconnections 38, 40 and 42 as well as portions of the dielectric plane 44. The NVRAM cell structure may include both source and bit lines in the first level of metallization. Both the source and bit lines in the NVRAM cell structure may run in a horizontal direction. The metallization may be formed from a variety of electrically conducting materials. Examples of materials that may be utilized in forming the first level metallization include CVD or sputter deposited aluminum or copper.

A second dielectric layer may then be laid down over the first dielectric layer, the stud interconnections 38, 40 and 42 and the first level of metallization 46 and 48. As shown in FIG. 2a, a via 52 may be formed in the second dielectric layer 50.

In the via 52, above the via, and on the surface of the second dielectric layer 50 surrounding the via, the floating gate 54 of the NVRAM cell structure is formed. The floating gate 54 contacts the conductive stud 42. The floating gate may be formed from any suitable material. For example, the floating gate may be made of CVD polysilicon. The polysilicon may be in-situ doped.

According to the present invention, the surface of the floating gate structure 54 may be roughened. The roughening may provide a high coupling coefficient. Methods for roughening such surfaces are known in art. An example of a process that may be utilized in roughening the surface of the floating gate or the other structures described herein includes depositing a layer of amorphous silicon and annealing it to convert it to polycrystalline silicon. Such a method is disclosed by U.S. Pat. No. 4,757,360 to Faraone, issued Jul. 12, 1988, the entire disclosure of which is hereby incorporated by reference. However, the floating gate structure may not be roughened. An extended floating gate according to the invention includes a larger surface area than a conventional gate.

A control gate 60 (FIG. 2a) preferably is provided over the floating gate 54. If the floating gate surface is roughened, the surface of the control gate 60 adjacent the surface of the floating gate 54 is correspondingly roughened since it is laid down on top of the surface of the floating gate 54.

The roughening of the surfaces where the floating gate and control gate meet may increase the capacitance of a stacked capacitor. The roughened surface increases the effective area of the capacitor. The roughened surfaces may serve as a tunneling oxide with a field enhanced tunneling method. However, it is not necessary to rough the gate surface.

According to an embodiment wherein the roughened polysilicon oxide is used as the tunneling oxide, the floating gate surface area may be minimized to improve the coupling ratio. Improving the coupling ratio may permit programming the gate at a lower voltage level. Carriers may be injected from the control gate to the floating gate.

According to another embodiment, the regular thin gate oxide may be utilized as a tunneling oxide for the NVRAM cell. The large floating gate surface area improves the coupling ratio. As stated above, roughening the surface of the floating gate is not necessary to achieve the increased surface area.

The programming rates of both of these embodiments of the NVRAM cell according to the invention may be performed according to conventional methods. Alternatively, the programming rates may occur from the floating gate to the drain or substrate or vice versa.

The control gate in the NVRAM cell preferably is a doped polysilicon. After being deposited, the polysilicon is patterned so that it forms the control gate for the NVRAM.

FIG. 2b shows an embodiment of a stacked capacitor DRAM according to the present invention. Similar to the NVRAM structure shown in FIG. 2a, the DRAM structure includes the source 62, drain 64 and trench isolation 28 regions. A DRAM according to the invention may also include a gate structure 86 and stud interconnections 76 and 78 similar to the NVRAM cell structure described above. However, as can be seen in the embodiment shown in FIG. 2b, the stud interconnections may only be formed above the source region 62 and drain region 64 and not the gate structure 86 in the DRAM cell according to the present invention.

After forming the stud interconnections, the first level metallization may be formed. However, in the embodiment of the DRAM shown in FIG. 2b, the first level of metallization may only be connected to the metallization layer (drain 80) rather than the source and the drain as in the embodiment of the NVRAM shown in FIG. 2a. Furthermore, the first level metallization of a DRAM according to the present invention may have a bit line in a horizontal direction and a word line in the vertical direction.

The word line may be formed of silicided polysilicon. For example, titanium may be deposited on the surface of the polysilicon. After annealing at a certain temperature for a period of time. Titanium reacts with polysilicon to form titanium silicide (TiSi with low resistivity).

As can be seen in the embodiment shown in FIG. 2b, the DRAM structure preferably includes a second dielectric layer 82. A via 84 may be formed in the second dielectric 82 of the DRAM structure as in the NVRAM structure. However, in the DRAM structure, the via opens on the stud interconnect 78 connected to the source 64, rather than the gate structure 30 of the NVRAM.

According to the present invention, a capacitor, or node plate, for the DRAM cell is provided in the via 84, the space above the via, and the surface of the second dielectric layer 82 surrounding the via. The capacitor of the DRAM cell may be made of polysilicon. The polysilicon may be doped in-situ. Doped polysilicon is the most suitable material for this structure since it may be used to form the control gate of the NVRAM and body of the SRAM.

As described above, regarding the NVRAM cell, the surface of the capacitor or node plate of the DRAM cell may be roughened. A thin layer of dielectric material may be grown or deposited over the surface of the capacitor of the node plate. The ground plate of the DRAM is on top of the thin dielectric layer as well as the surrounding surface of the second dielectric layer 82 surrounding the capacitor or node plate of the DRAM. If the surface of the capacitor or node plate is roughened, the roughened surface preferably is duplicated in the thin dielectric layer and the lower surface of the ground plate.

Figure 7C:
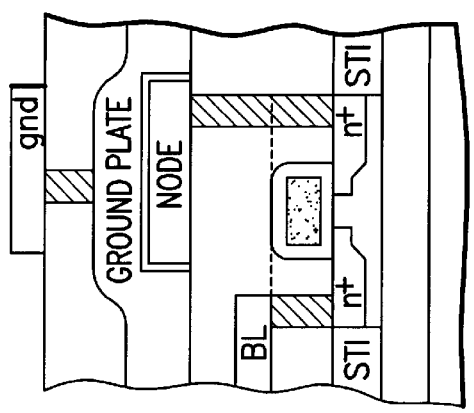
FIGS. 7a–7c represent cross-sectional views a the memory cells schematically shown in FIGS. 6a–c.
Figure 7B:
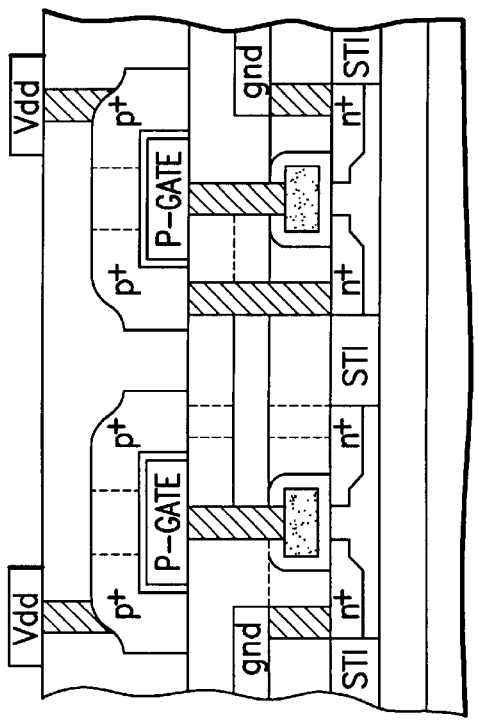
Figure 8C:
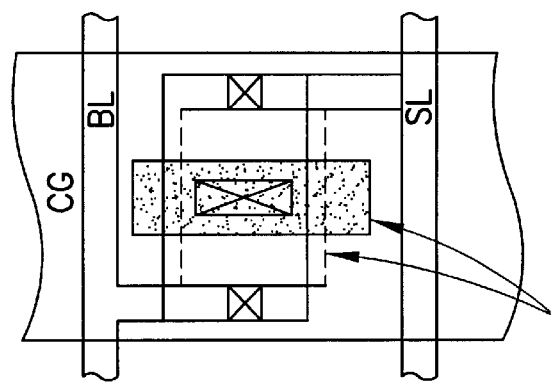
FIGS. 8a–8c represent overhead views of the memory cells shown in FIGS. 6a–6c and 7a–7c.
Figure 8B:
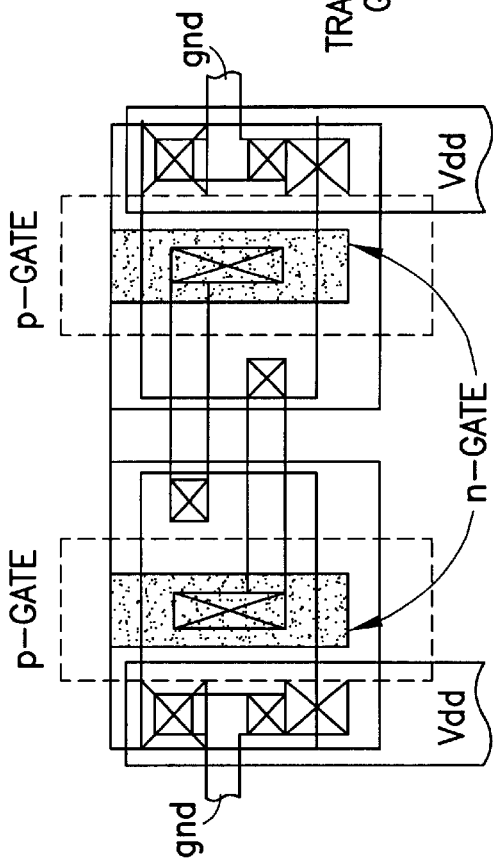

As stated above, the present invention may also be utilized to form an SRAM cell structure in the same memory device as the NVRAM and/or the DRAM cells discussed above. An embodiment of an SRAM according to the present invention is shown in FIG. 2c. FIG. 2c shows only one-half latch, one TFT device and one pull-down nfet. The other one-half latch should be substantially similar on the other side. Therefore, it is not shown in FIG. 2c. On the other hand, FIG. 7b and FIG. 8b show whole back-to-back SRAM latch, which includes two pull-up nfet TFT and 2 pull-down nfet devices, while two transfer gates are not shown.

The SRAM structure shown in FIG. 2c includes a source region 94 and a drain region 96 as with the NVRAM and DRAM structures described above. Shallow trench isolation regions 98 and 100 may also be provided adjacent the source region 94 and drain 96, respectively.

As with the NVRAM and DRAM structures above, the SRAM preferably includes a gate 102 including a gate structure 104 and an isolation structure 106. Again, similar to the above NVRAM and DRAM structures, the gate structure may be separated from the substrate by an insulating layer 107. The insulating layer may be a layer of an oxide material. Preferably, the insulating layer 107 is silicon dioxide.

The SRAM structure shown in FIG. 2c includes a stud interconnection 110 connected to the gate 102. The SRAM structure also includes the first dielectric layer 108 on top of the substrate including the source, drain, and isolation regions 94, 96, and 98 and 100, respectively. The first dielectric layer may also extend at least partially over the gate 102. The materials discussed above may also be used in forming the stud interconnection of the SRAM structure.

Unlike the NVRAM structure and DRAM structure shown in FIGS. 2a and 2b, the SRAM structure shown in FIG. 2c does not include a first level metallization. However, the second layer dielectric 112 is provided over the first layer of dielectric. Additionally, a via 114 is provided in the second dielectric layer.

In the SRAM structure according to the present invention, a TFT gate is located in the via, the space above the via, and space above the surface of the second dielectric layer surrounding the via. The TFT gate may be formed of a P-type load transistor. The load transistor is needed together with a pull-down n-fet transistor to form an inverter. For a full SRAM, two back-to-back inverters are required to form a full-latch. A schematic of this structure is shown in FIG. 7b.

As discussed above for the NVRAM and DRAM cells, the surface of the TFT gate may be roughened. The processes utilized above to roughen the surface of the node plate and floating gate of the DRAM and NVRAM cells, respectively, may be simultaneously used to roughen the surface of the TFT gate of the SRAM cell. A thin layer of dielectric 122 may be grown or deposited on a portion of the surface 120 of the TFT gate over which a TFT body may be located. The TFT body 126 is shown in FIG. 2c. The surface 124 of the TFT body adjacent the thin dielectric layer 122 may be roughened since the material of the TFT body is laid down over the roughened surface of the TFT gate.

The embodiment of the SRAM cell shown in FIGS. 7b and 8b includes two back-to-back inverters including two pull-up TFT load pfet devices and two n-fet devices.

FIG. 3a shows an embodiment of the NVRAM structure that includes a floating gate that has a smaller upper surface area. The smaller surface area may improve the coupling ratio, permitting use of a lower voltage level. Carriers may be injected from the control gate to the floating gate or vice versa. As stated above, the surfaces of the floating gate and the control gate need not be roughened.

Embodiments of the NVRAM structure shown in FIG. 3a include a thin dielectric layer or tunnel oxide between the floating gate and the control gate. Such embodiments may include a tunnel oxide of about 80 Å.

FIG. 3b shows an embodiment of a conventional NVRAM cell structure corresponding to an embodiment of the invention shown in FIG. 3a.

FIG. 4a shows an embodiment of an NVRAM structure according to the present invention wherein the floating gate has a larger upper surface area. Embodiments of the NVRAM structure according to the present invention that include such a floating gate may include a less roughened or smooth upper surface. The larger overall surface area of the floating gate accommodates the less surface area created by a lesser degree of roughening. However, as stated above, the surfaces of the control gate and the floating gate need not be roughened.

Embodiments of the NVRAM structure shown in FIG. 4a preferably include a tunnel oxide of about 30–40 Å.

Figure 6A:
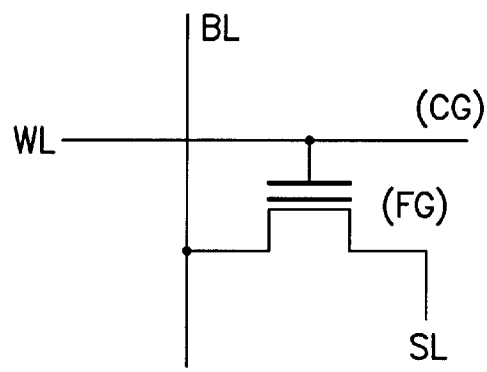
FIGS. 6a–6c represent schematic views of embodiments of a flash PROM cell, a TFT SRAM cell, and a DRAM stacked-cap cell according to the present invention.
Figure 6B:
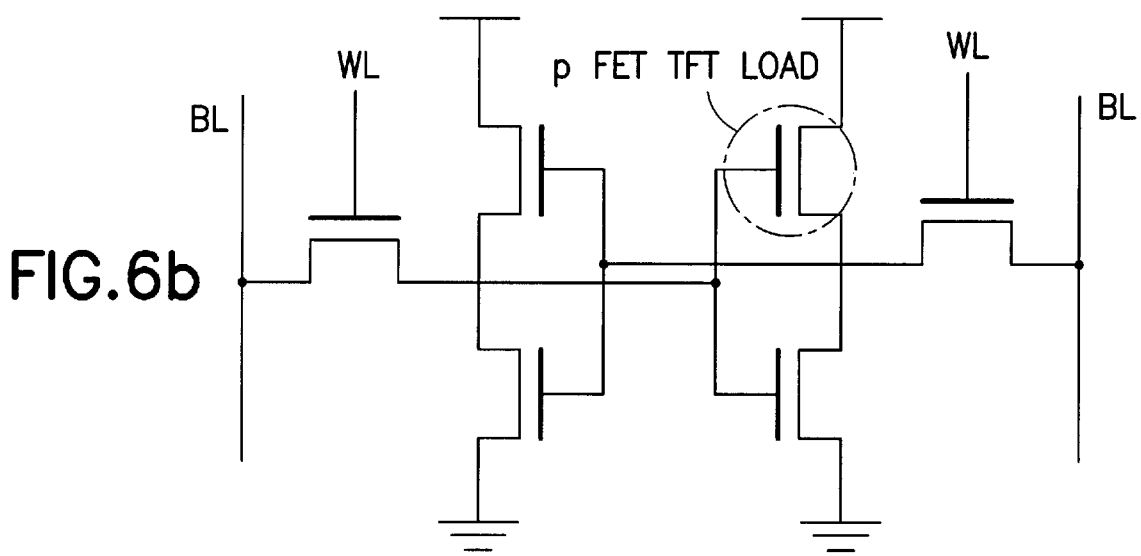
Figure 6C:
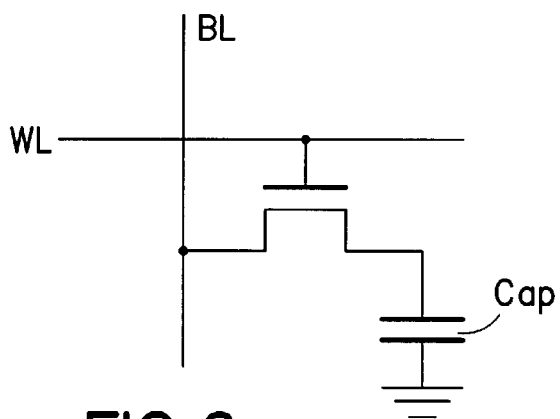
Figure 7A:
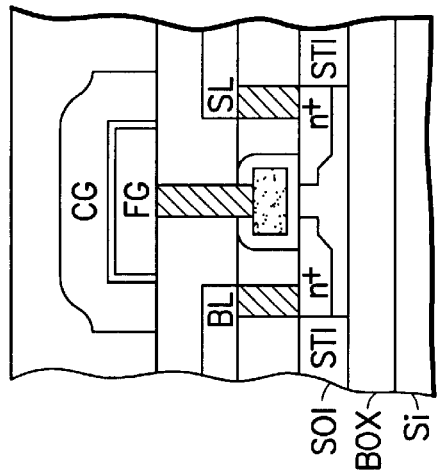
Figure 8A:
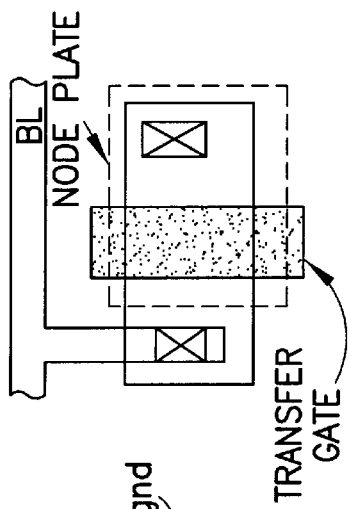

As discussed above, the present invention also includes methods for forming NVRAM cell structures, DRAM cell structures, and SRAM cell structures in the same semiconductor memory device. FIGS. 5a–5l show cross sectional views of various points in processes according to the present invention for forming the structures shown in FIGS. 7a–7c and 8a–8c. FIGS. 7a–c show cross sectional views of a flash PROM cell, a TFT SRAM, and a stacked capacitor DRAM cell, respectively, according to the present invention. FIGS. 8a–8c show overhead views of the structures shown in FIGS. 7a–7c respectively. FIGS. 6a–6c represent schematics of the memory cells shown in FIGS. 7a–7c, respectively.

In FIGS. 5a–5l, the left-hand memory cell corresponds to the flash PROM cell shown in FIGS. 7a and 8a. The central memory cell shown in FIGS. 5a–5l corresponds to the TFT SRAM cell shown in FIGS. 7b and 8b. Additionally, the right-hand memory cell shown being formed in FIGS. 5a–5l corresponds to the stacked capacitor DRAM cell shown in FIGS. 7c and 8c.

All of these processes begin by providing a semiconductor-on-insulator substrate such as an SOI substrate, and forming isolation and gate levels according to conventional methods that are well known in the art. The starting SOI substrate is/may be prepared by using any one of the various methods well known in the art, such as implanted oxygen (SIMOX), bonded SOI, or Smartcut tm methods as mentioned previously and/or described in for example: "SOI Technology," J. P. Colinge, Kluwer Academic Publishers, 1991; "SmartCut, A Promising New SOI Material Technology," M. Brud, et al, Proc. 1995 IEEE SOI Conf., ppgs 178–179; and U.S. Pat. Nos. 5,882,987; 5,784,311; 5,614,433; 5,681,775, which are all incorporated herein in their entireties by reference. Processes well known to those skilled in the art may be utilized to form the source region, drain region, trench isolation regions, and gate structures shown in FIGS. 2a, 2b, and 2c. Separate ion implantation masking steps may be required to optimize the Vt's of the DRAM and the NVRAM devices. The source, drain, and gate structures may all be silicided for low resistivity.

Figure 5A:
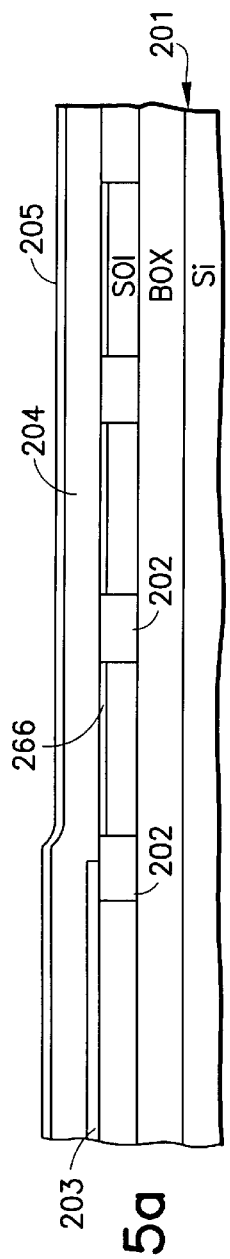
FIGS. 5a–5l represent cross-sectional views of an embodiment of a semiconductor memory device according to the present invention during various stages of an embodiment of a manufacturing process according to the present invention.

Accordingly, the process of forming the memory cells begins by forming the structure shown in FIG. 5a. FIG. 5a shows an SOI substrate 201 including all of the well implants, such as n-well, p-well, and others. These implants may be formed according to conventional processes. Shallow isolation regions 202 preferably are also formed according to conventional processes.

At least one portion of the SOI substrate 201 may be covered with a layer of pad insulation material 203. Examples of materials that may be utilized in the pad include oxide and nitride.

The remainder of the surface of the SOI substrate may be formed with a layer of a gate oxide 266. Examples of materials that may be utilized to form the gate oxide include a thermal oxide, a CVD oxide, or a CVD nitride. The gate oxide may have a thickness of about 6nm to about 12 nm.

A first layer of a polysilicon 204 may be deposited over the structure formed up to thus far. The polysilicon may be formed by CVD. A thin layer of a nitride 205 may then be deposited over the first polysilicon layer. The nitride layer may also be formed by CVD. After formation of the nitride layer, the structure should appear as shown in FIG. 5a.

Figure 5B:
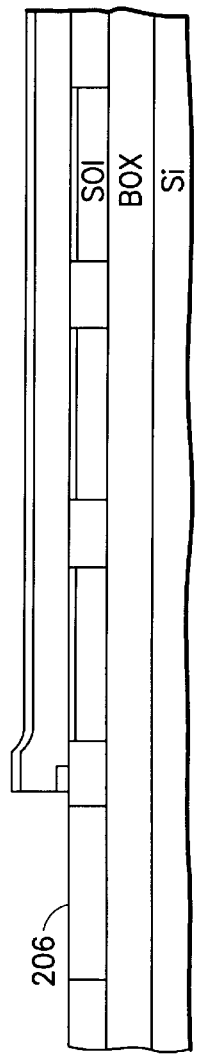

In FIG. 5b, a portion of the top nitride layer 205 on top of polysilicon layer 204 the pad material 203 is removed. The removal may be accomplished by a reactive ion etch process step. Subsequently, the pad material may be utilized for etch stop and then may also be removed. An example of a process that may be utilized to remove the pad material includes a wet etch and wet cleaning step.

A very thin layer of a dielectric 206 may then be formed on the exposed surface of the silicon layer (SOI). The dielectric may be a thermal oxide layer and may be formed by being grown on the exposed surface. The dielectric layer is also referred to as a tunneling oxide and may have a thickness of about 3 nm to about 5 nm. This layer is very thin and is represented by a thin line in FIG. 5b. The structure formed up to this point is shown in FIG. 5b.

Figure 5C:
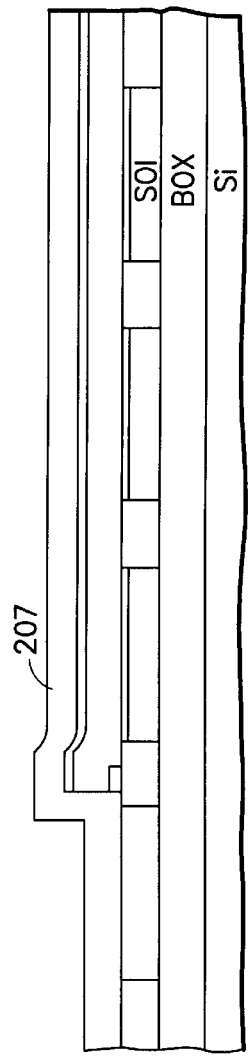

As shown in FIG. 5c, a second layer of a polysilicon 207 may be formed over the entire structure as shown in FIG. 5b. The second polysilicon layer 207 may be deposited by CVD.

Figure 5D:
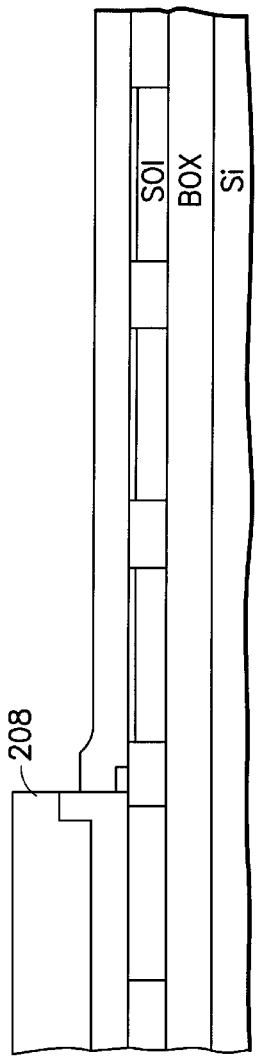

As shown in FIG. 5d, a photolithography resist pattern 208 may be utilized to remove portions of the second polysilicon layer lying over the first polysilicon layer. The photolithography resist pattern may then be stripped.

Figure 5E:
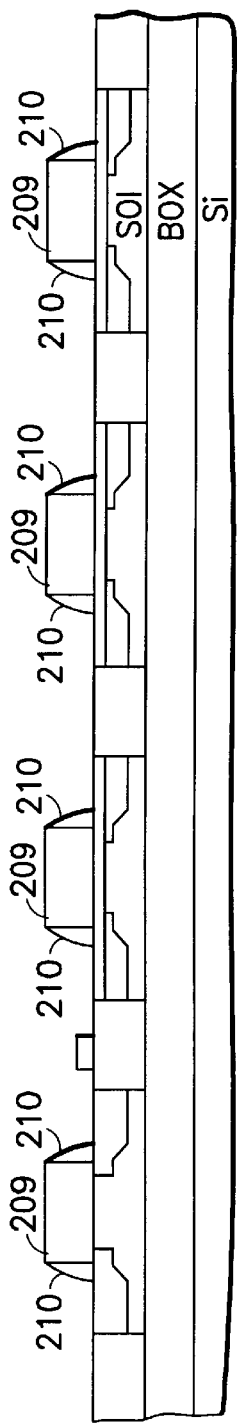

Gates of three devices, NVRAM, SRAM, and DRAM may be formed in a conventional etch process. Sidewall spacers 210 may be formed by deposition of a dielectric material and tailored by a blanket etch. The resulting structure is shown in FIG. 5e.

Figure 5F:
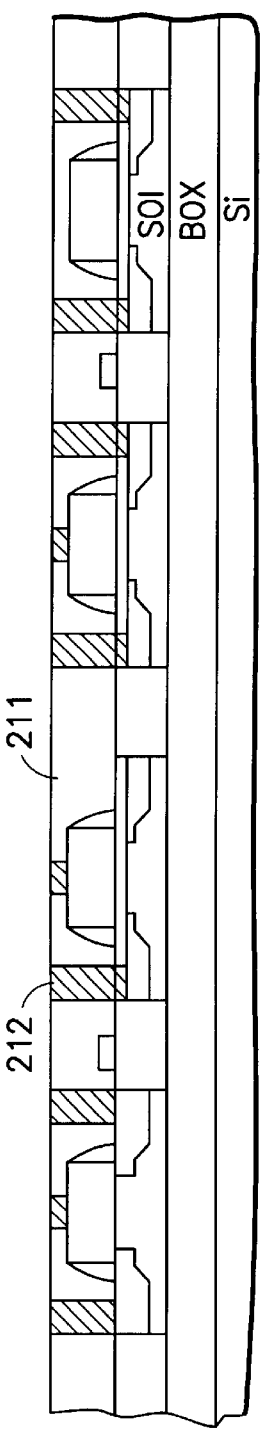

Next, the first dielectric plane 211 and the stud interconnections 212 may be formed according to conventional processes. As stated above, the stud interconnections in the NVRAM cell may only extend from the source, drain, and gate, whereas in the DRAM cell the stud interconnections may only extend from the source and drain. FIG. 5f shows a cross-sectional view of the devices after formation of the first dielectric plane and the stud interconnections.

Figure 5G:
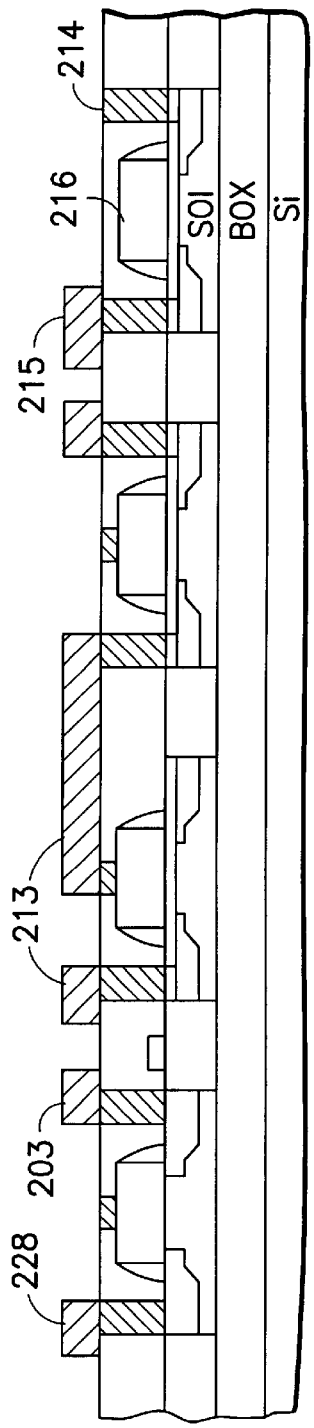

A first level metallization 213 may then be formed over the first dielectric layer and the stud interconnections. The metallization may be defined according to known, conventional means. The metallization and the overall structure are shown in a cross-sectional view in FIG. 5g. As can be seen in FIG. 5g, an NVRAM structure according to the invention includes metallization including a source line 228 and a bit line 203 running in a horizontal direction. On the other hand, the DRAM structure shown in FIG. 5g includes a bit line 215 in a horizontal direction. The DRAM also includes a word line 216, which is the polysilicon gate, in the vertical direction.

Figure 5H:
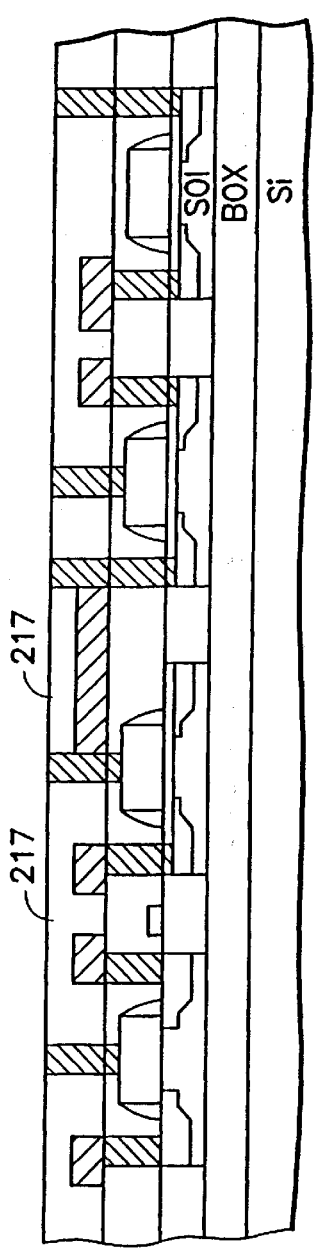
Figure 5I:
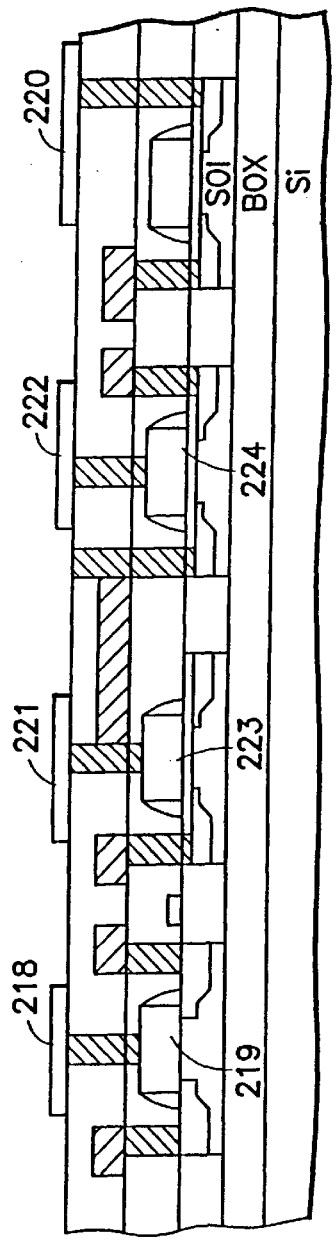

After the first level metallization has been laid down, a second layer of a dielectric material 217 may be deposited on the surface of the substrate and the first level metallization. Vias may then formed in the second dielectric layer. The location of the vias depends on the type of memory cell structure being formed. For example, in the NVRAM cell, the via is formed over the stud interconnection connected to the gate structure. This is shown in the left hand portion of FIG. 5h. As shown in FIG. 5h, the via may also extend to the surface of the second dielectric layer and an area in the vicinity of the second stud interconnection.

On the other hand, if the process of the present invention is being utilized to form a DRAM cell structure or an SRAM cell structure, the via preferably is formed over the stud interconnection connected to the drain region. This is shown in the right-hand portion and central portion, respectively, of FIG. 5h. Similarly to the above, the via may also extend about the surface area of the second dielectric layer in the vicinity of the stud interconnection connected to the drain region.

The second dielectric layer and via may be formed according to conventional methods.

As shown in FIG. 5h, in some instances, stud interconnections may be formed through the first and second dielectric layers to the source region or drain region in the substrate or to the gate structures formed on the substrate. Such stud connections may extend up as far as the top surface of the second dielectric layer.

Once the vias are formed, material preferably is deposited therein, as shown in FIG. 5h.

Next, the process includes forming functional portions of the DRAM, SRAM, and/or NVRAM cell structures. Forming the functional portions of the memory cells begins by forming a layer of material over the vias and stud interconnections formed in the second dielectric layer and on the surface of the second layer dielectric material surrounding the vias and stud interconnections. According to preferred embodiments, the material is an in-situ doped polysilicon. In this case, this can be considered a third polysilicon layer. The material is then patterned, according to the memory cell to be formed. For example, if the process is being utilized for forming an NVRAM cell, the material 218 is patterned to cover an area on and around the via or forming the floating gate extension of the NVRAM cell. Material 218 and 219 and the stud in between may form the whole floating gate of the NVRAM cell.

Alternatively, if the embodiment of the invention includes stud interconnections formed through the second dielectric layer, the functional portions of the memory structures may be formed by patterning the material so that it remains above the stud interconnections, extending on the surface of the second dielectric layer in the vicinity of the stud interconnections.

As discussed above, the present invention may also be utilized for forming a DRAM cell. If the process is being utilized to form the DRAM cell, the material is patterned, resulting in structure 220, so as to remain on and around the vias or the stud interconnections and on the surrounding surface of the second dielectric layer forms the capacitor or node plate of the DRAM cell.

If the invention is being utilized to form an SRAM cell, the via or stud interconnection may be formed in the second dielectric layer only over the stud interconnection connected to the gate as discussed above for the NVRAM cell. The patterned material 221 and 222 on and around the via, or on and around the stud interconnection, is a material suitable for forming gates of thin film transistor devices of the SRAM cell. An example of such a material is a p-type doped polysilicon. Indeed, gate material 221, which connected with gate 223, and gate 222 which connected with gate 224 by interconnection studs, are the gate for both top pfet devices as well as for bottom nfet devices.

Once the material is patterned, the exposed surface of the material may then be subjected to a roughening process. Examples of such roughening processes are described above.

After patterning the material or also roughening the surface of the patterned material, a thin layer of a dielectric material is deposited over the roughened surface. This dielectric may function as a tunnel layer. As can be appreciated from the embodiments shown in FIGS. 3a and 4a, if the surface of the patterned material is roughened, the roughened surface is reproduced in the dielectric deposited thereon. If the dielectric is substantially uniformly deposited over the entire roughened surface and is, in fact, a relatively thin layer.

Figure 5J:
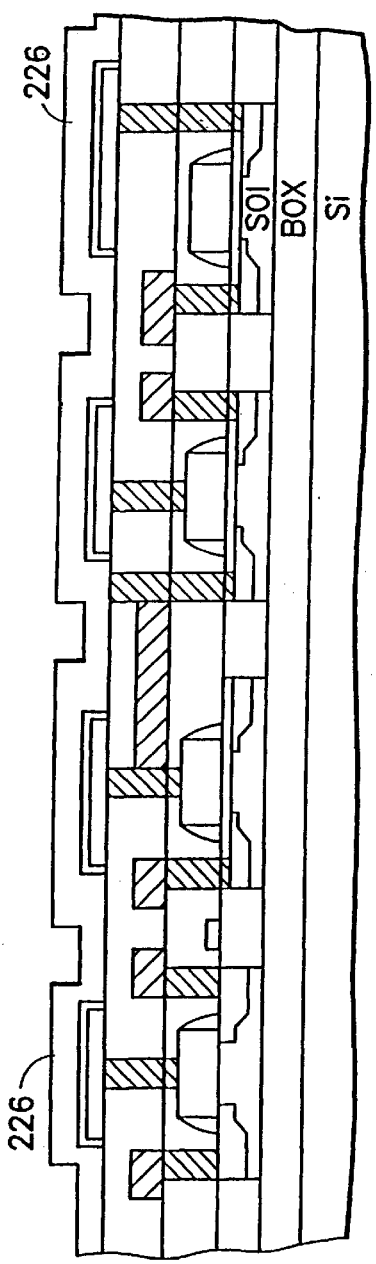

After depositing the dielectric on the patterned and possibly roughened surface, a layer of another layer of a conductive material is deposited on the dielectric deposited on the patterned material and the exposed surface of the second dielectric layer. This layer may be a third polysilicon layer 226. FIG. 5j shows the structure after deposition of the third polysilicon layer.

Figure 5K:
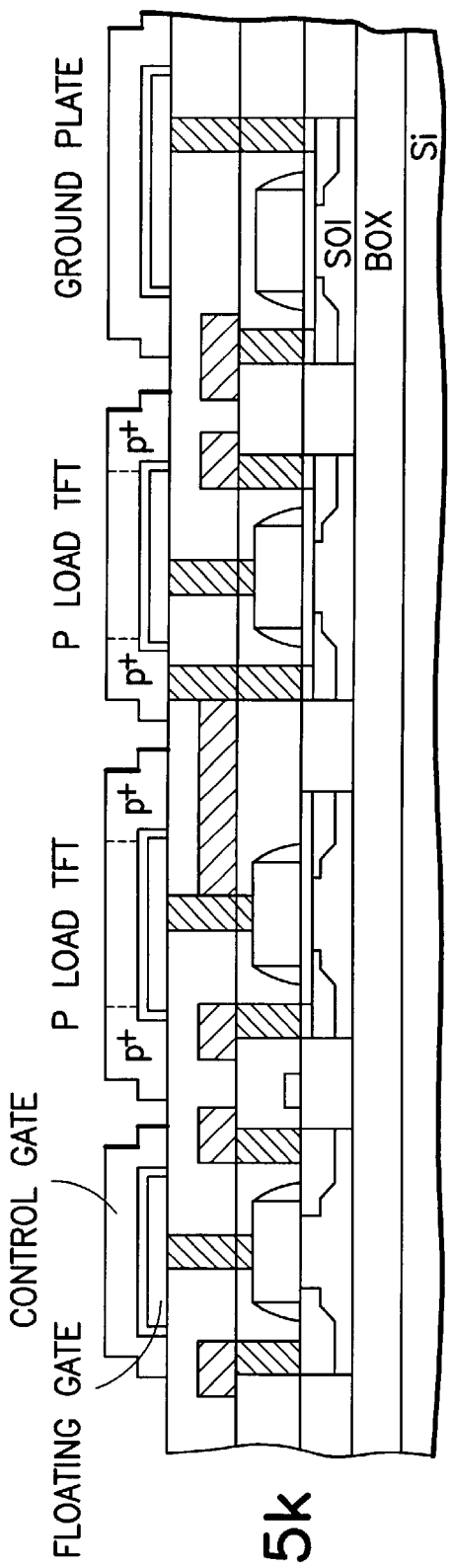
Figure 5L:
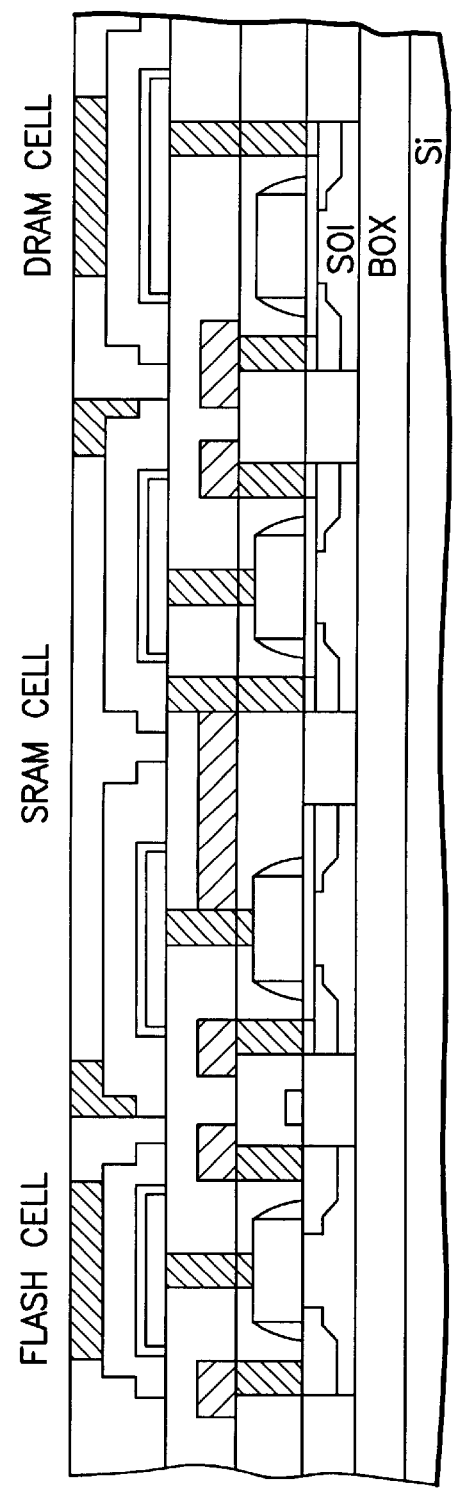

The third polysilicon layer may then be patterned, as shown in FIG. 5k. The function of the third polysilicon layer varies, depending upon the type of memory cell being produced. If the cell is an NVRAM cell, the material should be suitable for forming a control gate of the NVRAM cell. If the cell is a DRAM cell, the material should be suitable for forming the ground plate of the DRAM. If the cell is an SRAM cell structure, the material deposited on the dielectric should be suitable for forming a TFT body of the SRAM. The patterned material may require further processing, depending upon the required function. FIG. 5k also shows patterned and ion implantation processing have occurred in the SRAM cell, to form p+ regions formed toward the periphery as a source/drain of the top thin film transistor devices.

As can be appreciated, if the surface of the dielectric tunnel oxide layer is roughened, the surface of the material laid down upon it will have a roughened lower surface.

Once the memory cell structures are complete, additional processes may be carried out for forming other functional connections to the memory cell structures.

A significant advantage of the present invention is that the three different types of memory cells discussed above would be formed simultaneously since the present invention provides a similar structure that may be utilized in each type of memory cell. For example, the floating gate of the NVRAM cell may be formed at the same time as the node plate of a stacked capacitor of a DRAM cell. Both the floating gate, gate of TFT and the node plate may also be roughened at the same time. Additionally, the thin dielectric that is formed for the capacitor of the DRAM gate oxide for a TFT can also be tunneling oxide of the NVRAM cell.

A field enhanced tunneling mechanism may be used to program the floating gate from the control gate due to the roughened polysilicon surface. Furthermore, the control gate of the NVRAM cell may be formed at the same time as the grounded plate of the DRAM capacitor and the body of the TFT.

In order to implement NVRAM, DRAM or SRAM circuits, three additional process steps are required to form high voltage peripheral devices to handle high voltage operations. These steps may include thicker gate oxide, special LDD, and deeper junction implant.

The present invention provides a DRAM and SRAM process compatible and NVRAM cell structure. This structure and process for forming permits the incorporation of an NVRAM into a high density DRAM and SRAM memory architecture with a minimum cost penalty. Since one advantage of an NVRAM cell is density and flexibility higher than a fuse, and since the present invention permits the NVRAM cell structure to be incorporated in a memory device including DRAM and SRAM, the present invention provides great advantages in forming memory and logic applications. Since the structures are fabricated on an SOI substrate, the performance advantages which are inherent to SOI may be realized also for the supporting devices (such as wordline and bitline drivers) which drive the memory arrays. This results in increased bandwidth between the support circuitry and the memory arrays. By combining various types of memory devices and logic devices, the present invention may permit using a single memory chip rather than separate memory chips integrated at a system level. Furthermore, the present invention provides a relatively simple process with relatively few steps, avoiding additional, complex process steps, multiple mask levels and material layers in fabricating multiple types of memory cells on a single chip.

The present disclosure shows and describes only preferred embodiments of the present invention. As aforementioned, those reading the disclosure should understand that the invention may be used in other combinations and environments and may be changed or modified within the scope of the inventive concept expressed herein.

We claim:

1. A semiconductor memory device, comprising:

an NVRAM cell structure;

a DRAM cell structure; and an SRAM cell structure;

wherein said NVRAM cell structure, said DRAM cell structure, and said SRAM cell structure are on the same semiconductor-on-insulator substrate.

2. The semiconductor memory device according to claim 1, wherein said NVRAM cell structure includes a first floating gate, a second floating gate, an interconnection linking the first floating gate and the second floating gate, and a control gate on said second floating gate.

3. The semiconductor memory device according to claim 1, wherein said SRAM cell structure includes an NFET driver device, a PFET load device, an interconnection linking the gate of the driver device and the load device, and the body of the driver device.

4. The semiconductor memory device according to claim 3, wherein the load device is a thin film transistor device.

5. The semiconductor memory device according to claim 2, further comprising a polysilicon oxide disposed between said control gate and said floating gate and serving as a tunneling oxide.

6. The semiconductor memory device according to claim 2, wherein the surface of said second floating gate is roughened.

7. The semiconductor memory device according to claim 2, wherein a tunneling oxide is provided by a thin gate oxide deposited between said first said floating gate and said substrate.

8. The semiconductor memory device according to claim 1, wherein said DRAM cell structure includes a transfer gate device, a stack capacitor and a ground plate.

9. The semiconductor memory device according to claim 8, wherein the stack capacitor and the source of the transfer gate are linked by an interconnection stud.

* * * * *